(12) United States Patent
Lu et al.

(10) Patent No.: US 10,342,149 B2
(45) Date of Patent: Jul. 2, 2019

(54) OPENING AND CLOSING STRUCTURE OF ELECTRONIC DEVICE CASING

(71) Applicant: Hangzhou Mega Inno of Health Technology Co. Ltd, Hangzhou (CN)

(72) Inventors: Zhan-Sheng Lu, Shenzhen (CN); Yu-Chun Sun, New Taipei (TW)

(73) Assignee: Hangzhou Jiangyu Innovation Medical Technology Co., Ltd, Hangzhou (CN)

( * ) Notice: Subject to any disclaimer, the term of this patent is extended or adjusted under 35 U.S.C. 154(b) by 0 days.

(21) Appl. No.: 15/846,229

(22) Filed: Dec. 19, 2017

(65) Prior Publication Data
US 2019/0124781 A1    Apr. 25, 2019

(30) Foreign Application Priority Data
Oct. 25, 2017   (CN) .......................... 2017 1 1010021

(51) Int. Cl.
| H05K 5/02 | (2006.01) |
| H05K 5/03 | (2006.01) |
| E05D 15/28 | (2006.01) |

(52) U.S. Cl.
CPC ........... *H05K 5/0239* (2013.01); *E05D 15/28* (2013.01); *H05K 5/0247* (2013.01); *H05K 5/03* (2013.01); *E05Y 2900/606* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,588,624 B1 * | 7/2003 | Connors | ................... | E05D 7/12 16/341 |
| 6,825,413 B2 * | 11/2004 | Jeon | ........................ | H05K 5/03 174/50 |
| 7,133,290 B2 * | 11/2006 | Junkins | ................... | G06F 1/181 361/726 |
| 7,885,058 B2 * | 2/2011 | Li | ........................ | H05K 5/0239 361/679.01 |
| 7,891,994 B2 * | 2/2011 | Shi | ........................ | H05K 5/0239 439/131 |
| 7,903,396 B2 * | 3/2011 | Sasaki | .................. | H05K 5/0239 361/679.01 |
| 8,357,852 B2 * | 1/2013 | Drane | ...................... | H05K 5/03 174/66 |
| 8,995,135 B2 * | 3/2015 | Ogatsu | ................. | H05K 5/0217 292/341.17 |
| 9,037,036 B2 * | 5/2015 | Yamashita | .......... | G03G 21/1647 399/110 |

(Continued)

FOREIGN PATENT DOCUMENTS

| TW | I429369 | 3/2014 |
|---|---|---|
| TW | I565398 | 1/2017 |

*Primary Examiner* — Lisa Lea-Edmonds
(74) *Attorney, Agent, or Firm* — ScienBiziP, P.C.

(57) ABSTRACT

An opening and closing structure arranged on a casing of an electronic device includes a cover plate and at least one connecting assembly. The cover plate is arranged inside a groove defined in an outer surface of the casing. The connecting assembly includes a connecting rod. A first end of the connecting rod is coupled to the cover plate. A second end of the connecting rod passes through the groove. The connecting rod is slidable within the casing to allow the cover plate to open and close relative to the casing.

11 Claims, 4 Drawing Sheets

(56) References Cited

U.S. PATENT DOCUMENTS

| | | | | |
|---|---|---|---|---|
| 9,054,444 B2* | 6/2015 | Senatori | ............... | G06F 1/1633 |
| 9,485,336 B2* | 11/2016 | Shinoda | ............... | G06F 1/1656 |
| 2006/0109618 A1* | 5/2006 | Junkins | ................. | G06F 1/181 |
| | | | | 361/679.24 |
| 2010/0128420 A1* | 5/2010 | Li | ..................... | H05K 5/0239 |
| | | | | 361/679.01 |
| 2010/0142156 A1* | 6/2010 | Ogatsu | ............... | H05K 5/0217 |
| | | | | 361/724 |
| 2011/0032664 A1* | 2/2011 | Long | ................. | H04M 1/0274 |
| | | | | 361/679.01 |
| 2013/0003286 A1* | 1/2013 | Abe | ...................... | A63F 13/08 |
| | | | | 361/679.31 |
| 2013/0192869 A1* | 8/2013 | Drane | .................. | H02G 3/185 |
| | | | | 174/67 |
| 2013/0192889 A1* | 8/2013 | Meguro | .............. | G06F 1/1624 |
| | | | | 174/520 |
| 2013/0222986 A1* | 8/2013 | Nakatsu | ............. | H04N 5/2251 |
| | | | | 361/679.01 |
| 2014/0375196 A1* | 12/2014 | Nguyen | ............. | H05K 5/0226 |
| | | | | 312/329 |
| 2015/0047262 A1* | 2/2015 | Lee | ..................... | H05K 5/0239 |
| | | | | 49/394 |
| 2015/0351269 A1 | 12/2015 | Huang | | |
| 2017/0064849 A1* | 3/2017 | Kitaoka | ............. | H05K 5/0208 |

\* cited by examiner

OPENING AND CLOSING STRUCTURE OF ELECTRONIC DEVICE CASING

CROSS-REFERENCE TO RELATED APPLICATIONS

This application claims priority to Chinese Patent Application No. 201711010021.1 filed on Oct. 25, 2017, the contents of which are incorporated by reference herein.

FIELD

The subject matter herein generally relates to an opening and closing structure of a casing of an electronic device.

BACKGROUND

Generally, a casing of an electronic device includes ports, such as an audio port, a USB port, or the like. The ports may be covered to prevent dust from entering the ports. A cover of the ports is usually hinge-coupled to an outer surface of the casing.

BRIEF DESCRIPTION OF THE DRAWINGS

Implementations of the present disclosure will now be described, by way of example only, with reference to the attached figures.

DETAILED DESCRIPTION

Figure 1:
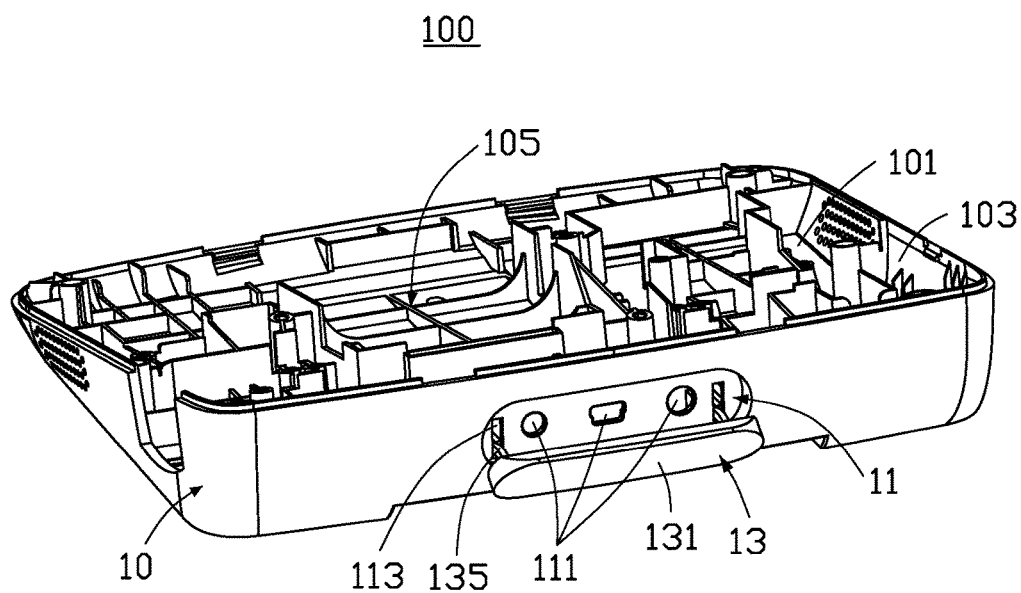
FIG. 1 is an isometric view of an exemplary embodiment of an opening and closing structure arranged on a casing of an electronic device in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates an embodiment of an electronic device 100. The electronic device 100 can be a mobile phone, a tablet computer, a medical tablet computer, or the like. In the illustrated embodiment, the electronic device 100 is a medical tablet computer.

The electronic device 100 includes a casing 10 and an opening and closing structure 13. The casing 10 includes a bottom plate 101 and a peripheral wall 103. The peripheral wall 103 surrounds the bottom plate 101 to cooperatively define an accommodating space 105. The accommodating space 105 is used for accommodating electrical elements, such as a battery, an antenna, a circuit, or the like.

An outer surface of the casing 10 defines a groove 11. In at least one embodiment, the groove 11 is defined in the peripheral wall 103. A shape of the groove 11 can be round, oval, or any shape according to actual requirements.

The groove 11 includes at least one port 111. The port 111 serves to electrically couple the electronic device 100 to an external device and can be a universal serial bus (USB) port, an earphone port, a storage card port, or the like. A shape of the port 111 is determined according to the shape of a plug of the external device required to be coupled to the electronic device 100. In the illustrated embodiment, the groove 11 includes three ports 111, which are an earphone port, a storage card port, and a USB port.

A through hole 113 is defined in the groove 11 on opposite sides of the ports 111. The through holes 113 correspond to the opening and closing structure 13 to cover the groove 11, thereby achieving anti-dust functionality and a good appearance.

Figure 2:
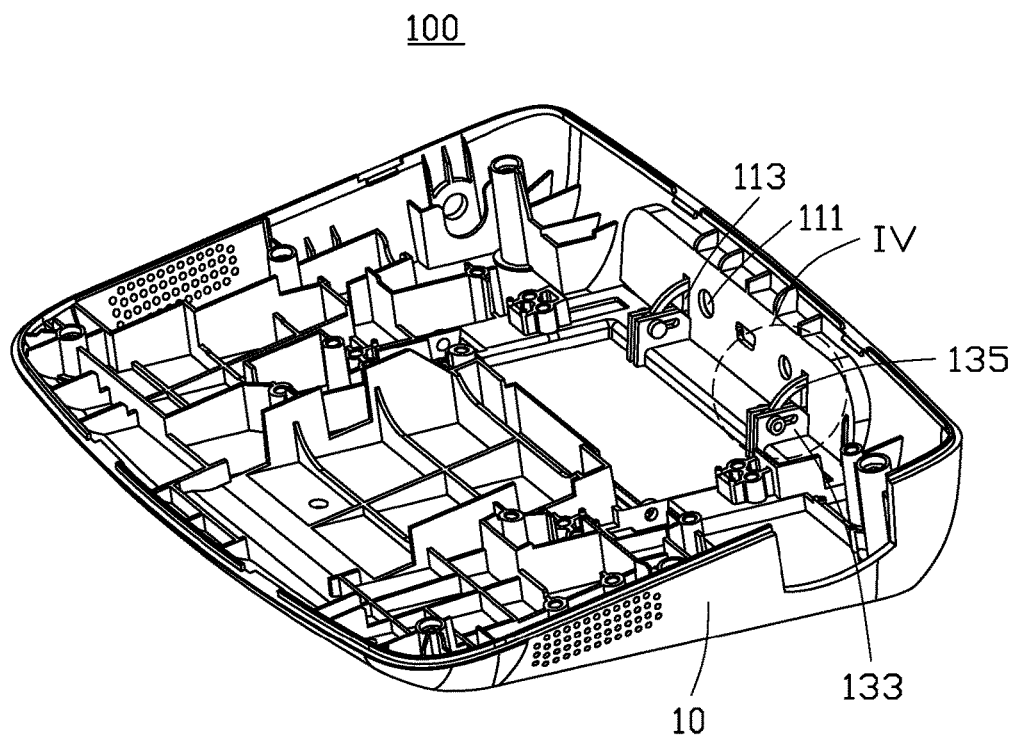
FIG. 2 is similar to FIG. 1, but shows another angle of the opening and closing structure.

Referring to FIG. 2, the opening and closing structure 13 includes a cover plate 131, at least one sliding seat 133, and at least one connecting assembly 135.

A shape of the cover plate 131 corresponds to the shape of the groove 11. The cover plate 131 is mounted in the groove 11 by the connecting assembly 135 and covers the groove 11 to achieve anti-dust functionality.

Figure 3:
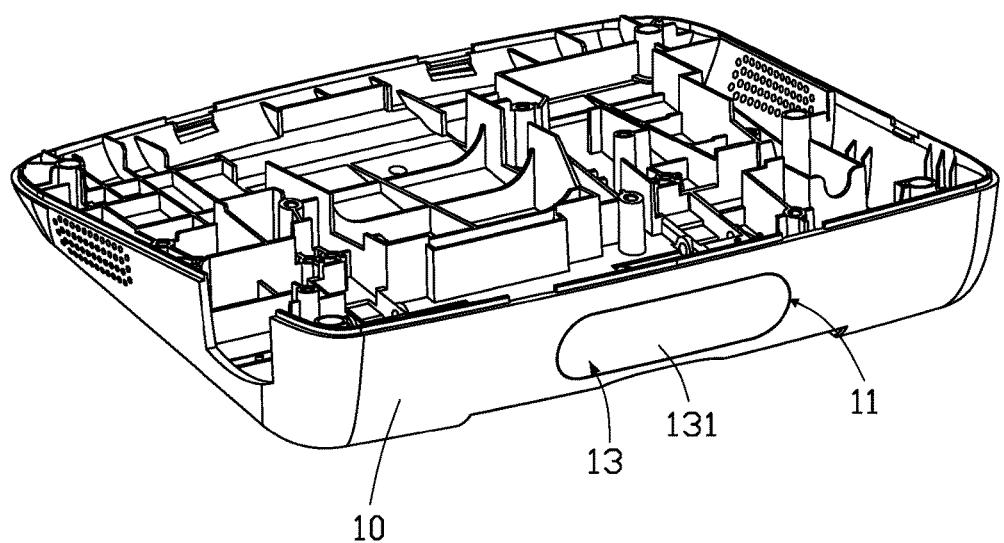
FIG. 3 is an isometric view of the casing in FIG. 1, wherein a cover plate of the opening and closing structure is in a closed configuration.

Referring to FIG. 3, an outer surface of the cover plate 131 is flush with an outer surface of the casing 10 to achieve a good appearance of the casing 10.

Referring again to FIG. 2, in at least one embodiment, the opening and closing structure 13 includes two sliding seats 133 and two connecting assemblies 135. The two sliding seats 133 are arranged inside the casing 10 and separately arranged adjacent to opposite sides of the groove 11. Each sliding seat 133 is coupled to the cover plate 131 through a corresponding connecting assembly 135 to allow the cover plate 131 to open and close to cover and uncover the groove 11, and further allow the cover plate 131 to open and close smoothly.

Figure 4:
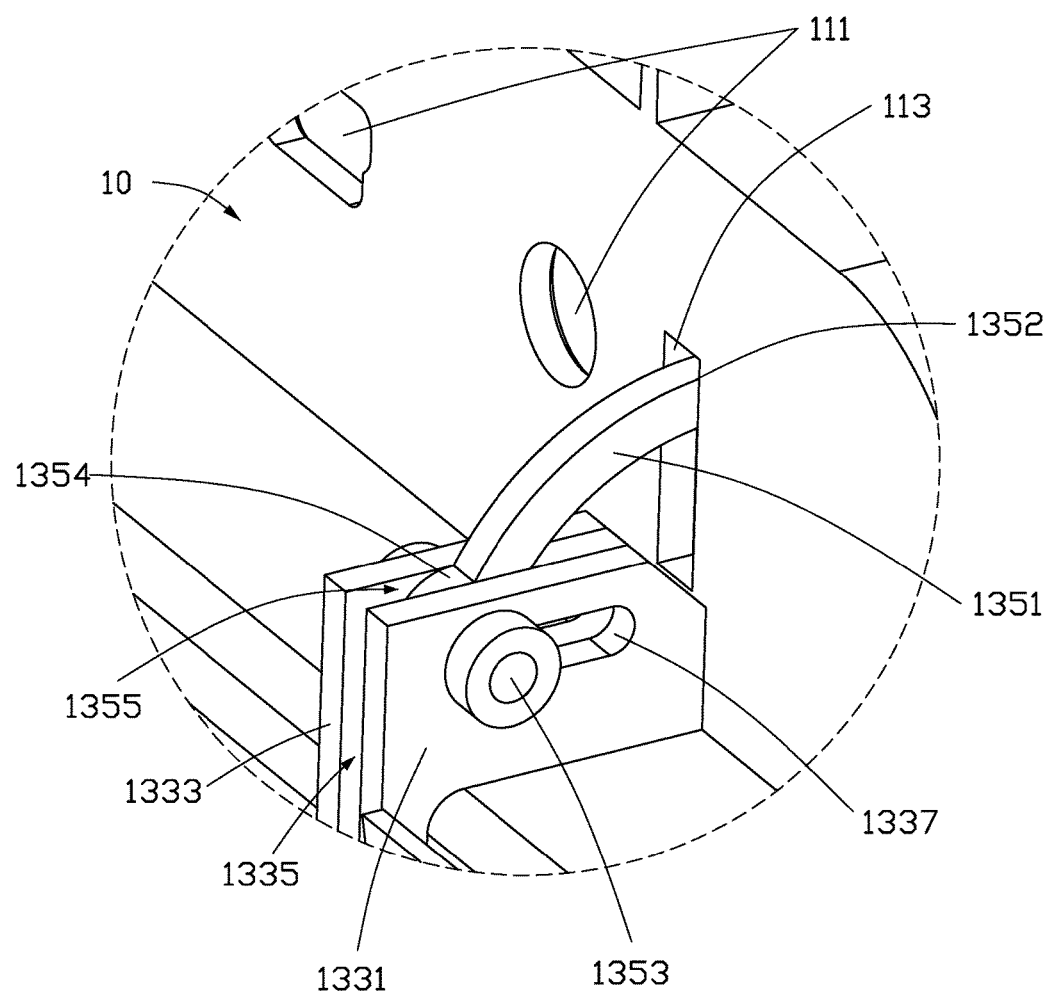
FIG. 4 is a close up view of a connecting assembly of the opening and closing structure.

Referring to FIG. 4, each sliding seat 133 includes a first guiding member 1331 and a second guiding member 1333. The first guiding member 1331 and the second guiding member 1333 are substantially rectangular plate-shaped. An accommodation slot 1335 is cooperatively defined between the first guiding member 1331 and the second guiding member 1333.

Each of the first guiding member 1331 and the second guiding member 1333 define a sliding slot 1337. The sliding slots 1337 are substantially parallel and opposite to each other. The sliding slot 1337 is substantially rectangular with rounded ends. The sliding slots 1337 are oriented toward the cover plate 131.

The connecting assembly 135 includes a connecting rod 1351 and a connecting shaft 1353. The connecting rod 1351 includes a first end 1352 and a second end 1354. The connecting rod 1351 can pass through the corresponding through hole 113 such that the first end 1352 and the second end 1354 are at opposite sides of the through hole 113. The first end 1352 of the connecting rod 1351 is coupled to a side of the cover plate 131 facing the groove 11. The second end 1354 of the connecting rod 1351 is arranged in the casing 10 and slidably coupled to the sliding seat 133 through the connecting shaft 1353.

In detail, a connecting hole 1355 is defined through the second end 1354 of the connecting rod 1351. The second end 1354 is received within the receiving slot 1335 such that the connecting hole 1355 is aligned with the sliding slots 1337. Then, the connecting shaft 1353 is received through the sliding slot 1337 of the first guiding member 1331, the connecting hole 1355, and the receiving slot 1337 of the second guiding member 1333, thereby slidably coupling the second end 1354 of the connecting rod 1351 to the sliding seat 133. The connecting shaft 1353 allows the second end 1354 to slide along the sliding slots 1337, thereby allowing the cover plate 131 to open and close. The connecting shaft 1353 received through the second end 1354 of the connecting rod 1351 causes the connecting rod 1351 to rotate relative to the connecting shaft 1353. In at least one embodiment, the connecting shaft 1353 is a rotation shaft.

A length of the connecting rod 1351 can be adjusted to control an open angle of the cover plate 131 relative to the casing 10.

Referring again to FIG. 1, when a port 111 in the groove 11 needs to be used, the cover plate 131 is opened to rotate relative to the groove 11 (such as a clockwise rotation). Simultaneously, since the first end 1352 of the connecting rod 1351 is coupled to the cover plate 131, the cover plate 131 pulls the second end 1354 of the connecting rod 1351, thereby causing the second end 1354 to slide along the sliding slots 1337 toward the cover plate 131, until the cover plate 131 is open and defines an angle with the casing 10 to allow access to the port 111.

Referring again to FIG. 3, when the cover plate 131 needs to be closed, the cover plate 131 rotated (such as counter-clockwise) to cover the groove 11. Simultaneously, since the first end 1352 of the connecting rod 1351 is coupled to the cover plate 131, the cover plate 131 pushes the second end 1354 of the connecting rod 1351, thereby causing the second end 1354 to slide along the sliding slots 1337 away from the cover plate 131, until the cover plate 131 is received in the groove 11.

The opening and closing structure 13 is used for covering the groove 11 to achieve anti-dust functionality and a good appearance. The connecting assembly 135 is slidably coupled to the sliding seat 133 to allow the cover plate 131 to open and close relative to the casing 10. Assembly of the opening and closing structure 13 is simple. Operation is smooth, and the opening and closing structure 13 can be adapted for use in the casing 10 having any size. Furthermore, the connecting rod 1351 is received in the casing 10, thereby ensuring a good appearance of the casing 10.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An opening and closing structure arranged on a casing of an electronic device, the opening and closing structure comprising:
   a cover plate arranged inside a groove defined in an outer surface of the casing; and
   at least one connecting assembly comprising a connecting rod, wherein a first end of the connecting rod is coupled to the cover plate, a second end of the connecting rod passes through the groove and is slidable within the casing, thereby allowing the cover plate to open and close relative to the casing;
   wherein the connecting assembly comprises a sliding seat arranged inside the casing; the first end of the connecting rod is coupled to the cover plate, and the second end of the connecting rod is slidably coupled to the sliding seat;
   wherein the sliding seat comprises a first guiding member and a second guiding member facing each other; an accommodating slot is cooperatively defined between the first guiding member and the second guiding member; the second end of the connecting rod is received in the accommodating slot;
   wherein the connecting assembly comprises a connecting shaft; the first guiding member and the second guiding member each define a sliding slot; the second end of the connecting rod defines a connecting hole; the connecting shaft is received through the sliding slot of the first guiding member, the connecting hole, and the sliding slot of the second guiding member to slidably couple the second end of the connecting rod to the sliding seat, thereby allowing the second end of the connecting rod to slide along the sliding slot.

2. The opening and closing structure of claim 1, wherein the sliding slot is rectangular.

3. The opening and closing structure of claim 1, wherein the connecting shaft slides toward or away from the cover plate.

4. The opening and closing structure of claim 1, wherein the connecting rod is arc-shaped.

5. An electronic device comprising:
   a casing; and
   an opening and closing structure arranged on the casing, wherein the opening and closing structure comprises:
      a cover plate arranged inside a groove defined in an outer surface of the casing; and at least one connecting assembly comprising a connecting rod, wherein a first end of the connecting rod is coupled to the cover plate, a second end of the connecting rod passes through the groove and is slidable within the casing, thereby allowing the cover plate to open and close relative to the casing;
   wherein the casing comprises a bottom plate and a peripheral wall; the peripheral wall surrounds the bottom plate; an accommodating space is cooperatively defined by the bottom plate and the peripheral wall; the groove is defined in the peripheral wall; the cover plate is arranged in the groove by the connecting assembly and covers the groove;
   wherein the connecting assembly comprises a sliding seat arranged inside the casing; the first end of the connecting rod is coupled to the cover plate, and the second end of the connecting rod is slidably coupled to the sliding seat;

wherein the connecting assembly comprises a connecting shaft; the first guiding member and the second guiding member each define a sliding slot; the second end of the connecting rod defines a connecting hole; the connecting shaft is received through the sliding slot of the first guiding member, the connecting hole, and the sliding slot of the second guiding member to slidably couple the second end of the connecting rod to the sliding seat, thereby allowing the second end of the connecting rod to slide along the sliding slot.

6. The electronic device of claim 5, wherein the sliding slot is rectangular.

7. The electronic device of claim 5, wherein the connecting shaft slides toward or away from the cover plate.

8. The electronic device of claim 5, wherein the connecting rod is arc-shaped.

9. The electronic device of claim 5, wherein the sliding seat comprises a first guiding member and a second guiding member facing each other; an accommodating slot is cooperatively defined between the first guiding member and the second guiding member; the second end of the connecting rod is received in the accommodating slot.

10. The electronic device of claim 5, wherein at least one port is located in the groove; the port serves to electrically couple the electronic device to an external device.

11. The electronic device of claim 5, wherein at least one through hole is defined in the groove; the connecting rod passes through the at least one through hole to couple to the cover plate.

* * * * *